United States Patent
Lu

(10) Patent No.: US 8,274,181 B2
(45) Date of Patent: Sep. 25, 2012

(54) STRUCTURE FOR TRANSMISSION IN POWER SUPPLY

(75) Inventor: Shao-Feng Lu, Taoyuan Hsien (TW)

(73) Assignees: FSP Technology Inc., Taoyuan, Taoyuan Hsien (TW); 3Y Power Technology (Taiwan), Inc., Gueishan Shiang, Taoyuan Hsien (TW)

( * ) Notice: Subject to any disclaimer, the term of this patent is extended or adjusted under 35 U.S.C. 154(b) by 290 days.

(21) Appl. No.: 12/418,764

(22) Filed: Apr. 6, 2009

(65) Prior Publication Data
US 2010/0253155 A1    Oct. 7, 2010

(51) Int. Cl.
*H01B 7/30* (2006.01)
*H01B 11/02* (2006.01)
*H02B 1/20* (2006.01)
*H02G 5/06* (2006.01)

(52) U.S. Cl. ........ 307/147; 361/620; 361/760; 361/788; 361/794; 361/836; 361/622; 361/624; 361/627; 361/637; 361/638; 361/639; 361/640; 174/250; 174/251; 174/252; 174/253; 174/254; 174/255; 174/256; 174/257; 174/258; 174/259; 174/260; 174/261; 174/262; 174/263; 174/264; 439/329; 439/541.5; 439/620.01; 320/108; 307/104

(58) Field of Classification Search ............ None
See application file for complete search history.

(56) References Cited

U.S. PATENT DOCUMENTS

| 5,561,594 | A  | * | 10/1996 | Wakefield | 361/760 |
|---|---|---|---|---|---|
| 6,014,319 | A  | * | 1/2000 | Kuchta et al. | 361/788 |
| 7,765,673 | B2 | * | 8/2010 | Fauh et al. | 29/593 |
| 2002/0015293 | A1 | * | 2/2002 | Akiba et al. | 361/793 |
| 2002/0139467 | A1 | * | 10/2002 | Tomioka | 156/92 |
| 2005/0103521 | A1 | * | 5/2005 | Vinciarelli et al. | 174/260 |
| 2006/0131068 | A1 | * | 6/2006 | Rodriguez | 174/260 |
| 2008/0298035 | A1 | * | 12/2008 | Kajio et al. | 361/784 |

* cited by examiner

*Primary Examiner* — Rexford Barnie
*Assistant Examiner* — Justen Fauth
(74) *Attorney, Agent, or Firm* — Winston Hsu; Scott Margo

(57) ABSTRACT

A structure for transmission in a power supply, particularly to a power structure for transmission for bearing large DC current, wherein the power supply includes a power input port for connecting to DC input power and a DC/DC conversion circuit for converting the DC input power into DC output power. The architecture including at least one power transmission board for disposing the power input port, wherein the power transmission board is electrically connected to the power process board with the DC/DC conversion circuit mounted thereon by at least one power conduction element. Therefore, through the power conduction elements replacing the conventional connecting wires with large diameter to connect the power input port and the power process board without disobeying the safety regulation, not only the space occupied by the bent connection wires can be reduced, but the collisions and damage to other components caused therefrom also can be avoided.

19 Claims, 6 Drawing Sheets

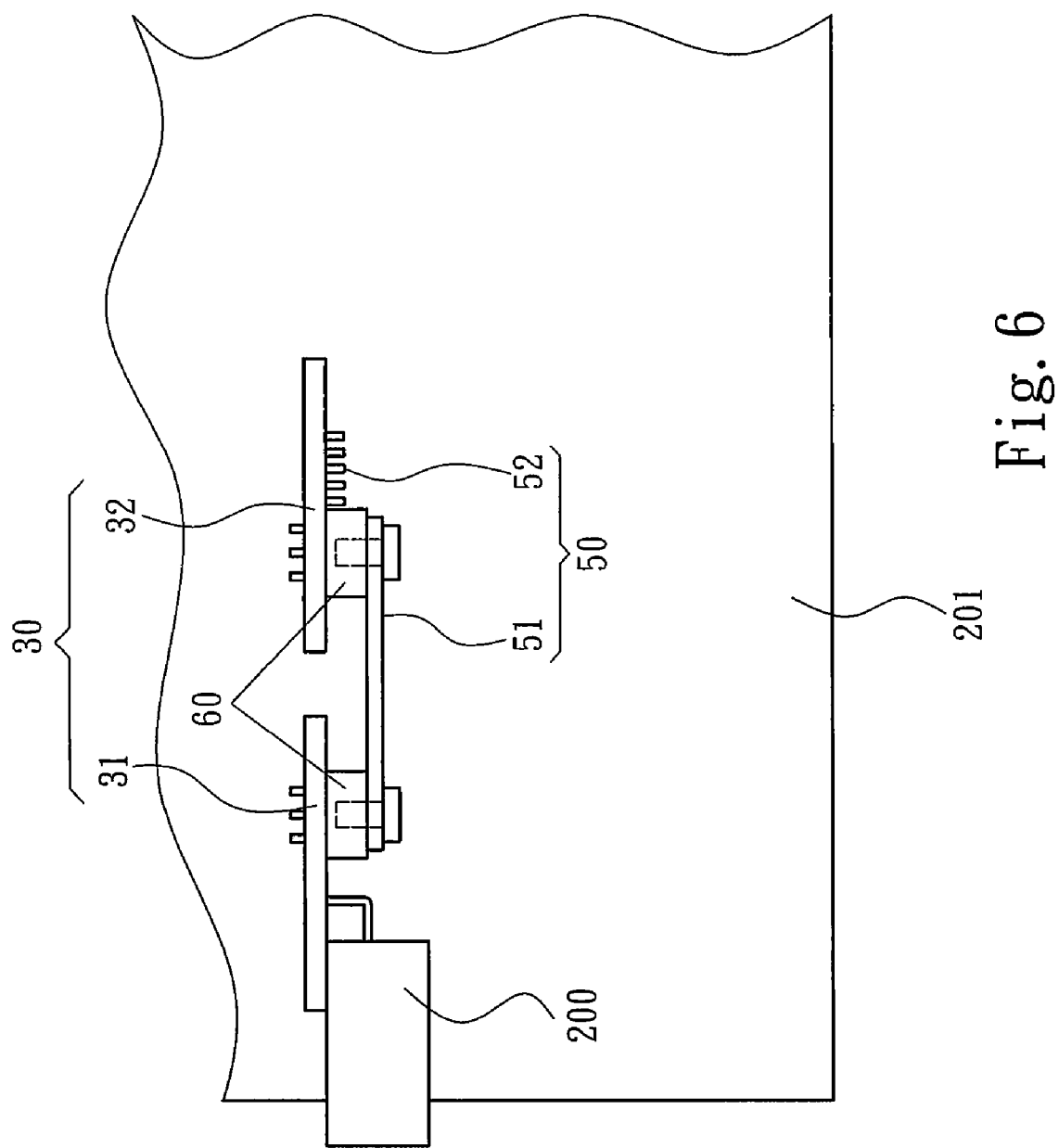

STRUCTURE FOR TRANSMISSION IN POWER SUPPLY

FIELD OF THE INVENTION

The present invention is related to a structure for transmission in a power supply, and more particularly to a structure for power transmission to bear large DC current.

BACKGROUND OF THE INVENTION

Consumer electronics, such as mobile phone, digital camera, PDA, MP3 player, have already become a part of our daily life. Owing to the development of technology, e.g., the growing integration capability of IC and the increasing precision of other electronic components, the volume of the technical electronics becomes smaller and smaller. Similarly, electronic products with larger power, such as power supply and UPS (Uninterruptible Power Supply) system, are also influenced to become miniaturized.

The major difference between electronic products with larger and smaller power is the power level of the power converter (such as transformer) because the power level is relative to the pressure resistance and the current resistance of the employed material, so it is difficult to reduce the volume as the power is large. Thus, the electronic products with larger power only can reduce the volume of other portions. The most common manner is to minimize the distance from the power I/O port and the signal transmission port to the main circuit board, so as to reduce the occupied space. Please refer to FIG. 1 which shows one kind of prior art. As shown, the connection wires 120 for the signal transmission port 110 have a small diameter with relatively greater flexibility, so that the connection between the signal transmission port 110 and the circuit board 100 almost can be disposed in any fashion and still complying with the safety regulation. However, for electronic product with larger power, as shown in FIG. 2 which shows another kind of prior art, because the transmitted current is relatively larger, the connection wires 120 between the power transmission port 130 and the circuit board 100 have a larger diameter for complying with the safety regulation, and as known, the greater the current, the larger the diameter. Further, for DC power transmission, owing to the more critical safety regulation, this situation becomes more serious. Therefore, if it wants to reduce the distance between the power transmission port 130 and the circuit board 100, just like the signal transmission port 110 in FIG. 1, the difficulty in arranging the connection wires 120 will increase since the large diameter reduces the flexibility thereof. So, the occupied space can not be reduced. Moreover, in practice, the larger diameter of the connection wire 120 also influences the assembling which not only wastes time and labor but also increases inconvenience. Therefore, for a long time, the volume of the electronic products with larger power can not be reduced effectively.

Consequently, since the larger diameter for greater current transmission is unavoidable under safety regulation, how to provide a structure for transmission in the power supply which can solve the problem described above and still comply with the safety regulation is really urgent.

SUMMARY OF THE INVENTION

The object of the present invention is to provide a structure for transmission which can significantly reduce the space occupied by the DC power transmission configuration and simultaneously comply with the safety regulation for large current.

For achieving the object described above, the present invention provides a structure for transmission in a power supply, wherein the power supply includes a power input port for connecting to DC input power and a DC/DC conversion circuit for converting the DC input power into DC output power. The architecture is characterized in including at least a power transmission board for disposing the power input port, wherein the power transmission board is electrically connected to the power process board with the DC/DC conversion circuit mounted thereon by at least a power conduction element. Here, the power conduction elements are made of rigid conductive material, such as copper or aluminum.

Accordingly, the present invention is advantageous that:

Compared to the conventional connection wires with large diameter for bearing large current without disobeying the safety regulation which has difficulty in bending and needs more reserved space for disposition, the present invention utilizes the power conduction elements to achieve the electrical connection so as to save the occupied space by the bent wires.

Compared to the conventional connection wires which are inadequately bent in the limited space to cause unpredictable collisions and damage to other components, the architecture achieved by power conduction elements of the present invention can precisely maintain the distance to other components even in the limited space so as to prevent the collisions and damage.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 6 is a vertical view showing the present invention in the third embodiment.

DESCRIPTION OF THE PREFERRED EMBODIMENT

Figure 1:
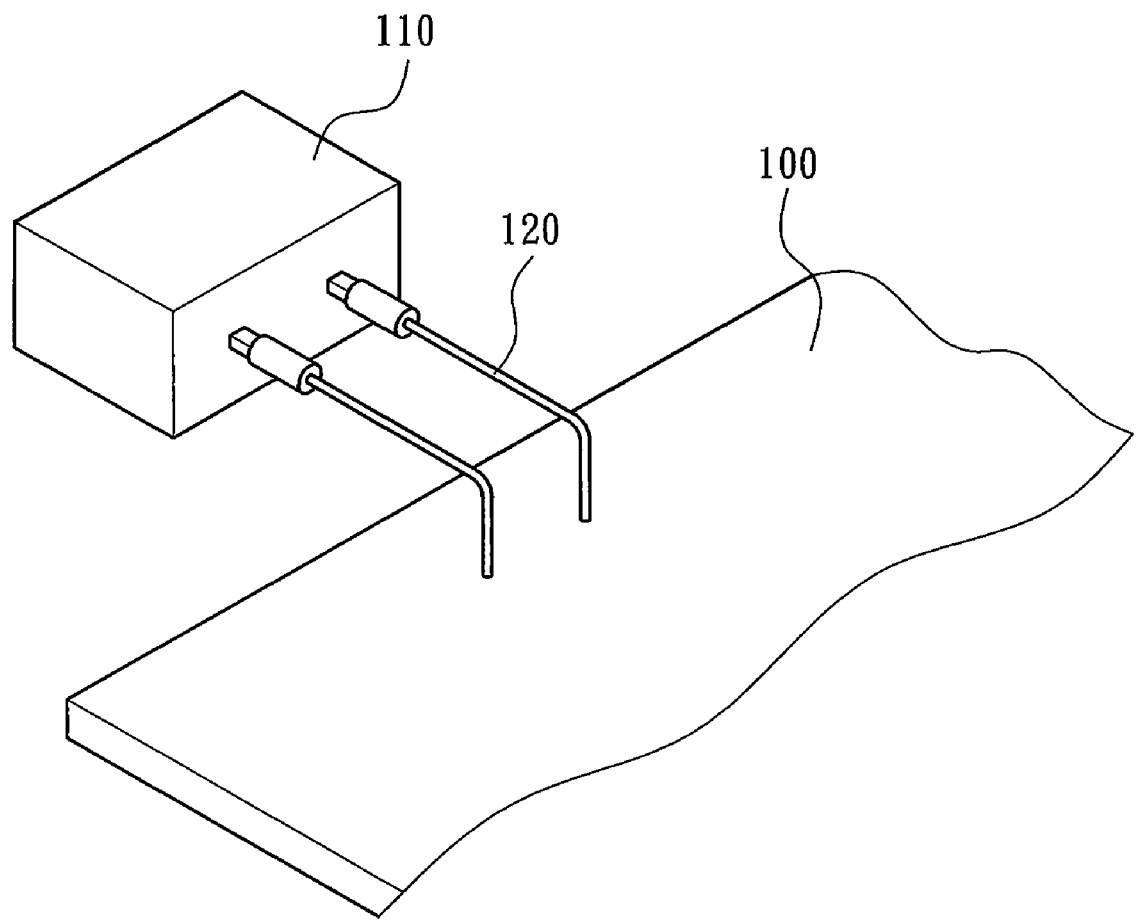
FIG. 1 is a schematic view showing one kind of prior art.
Figure 2:
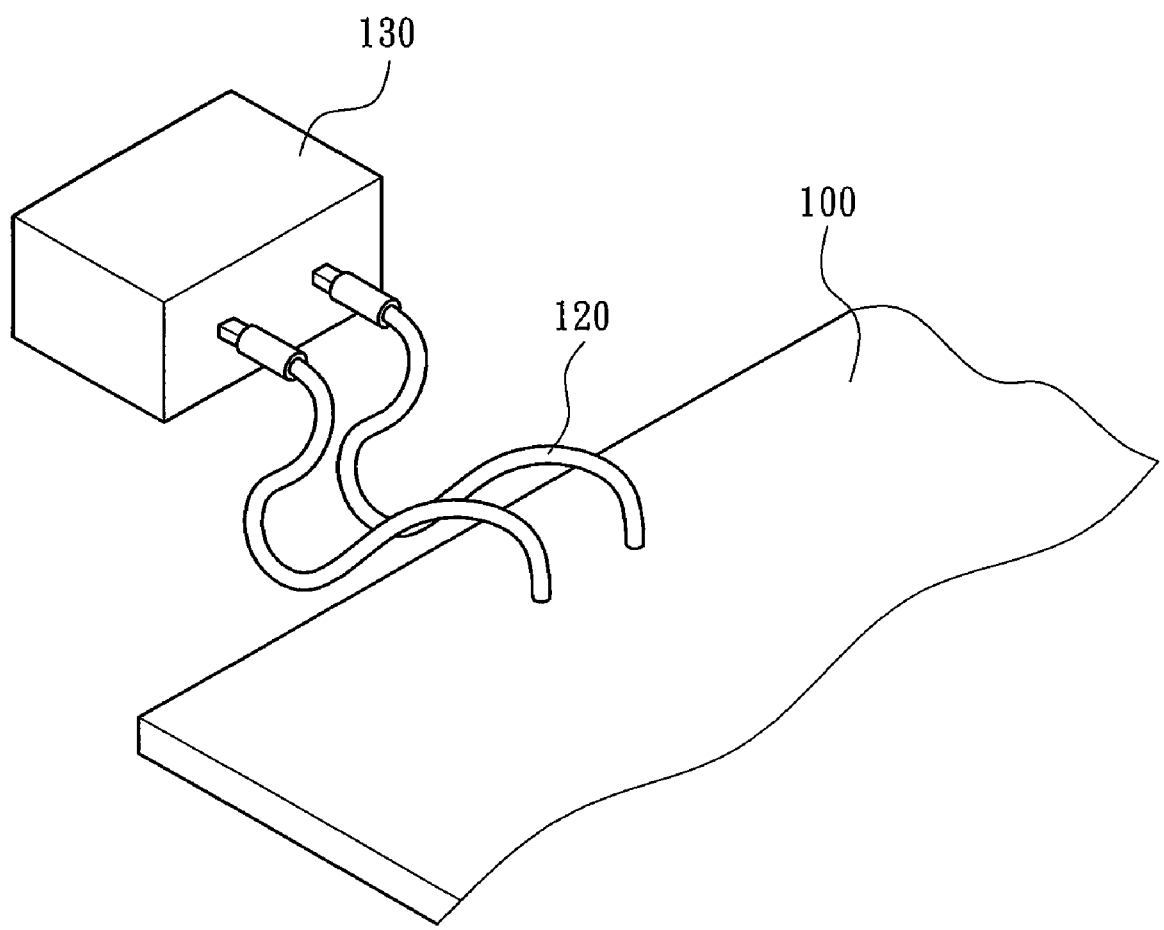
FIG. 2 is a schematic view showing another kind of prior art.
Figure 3:
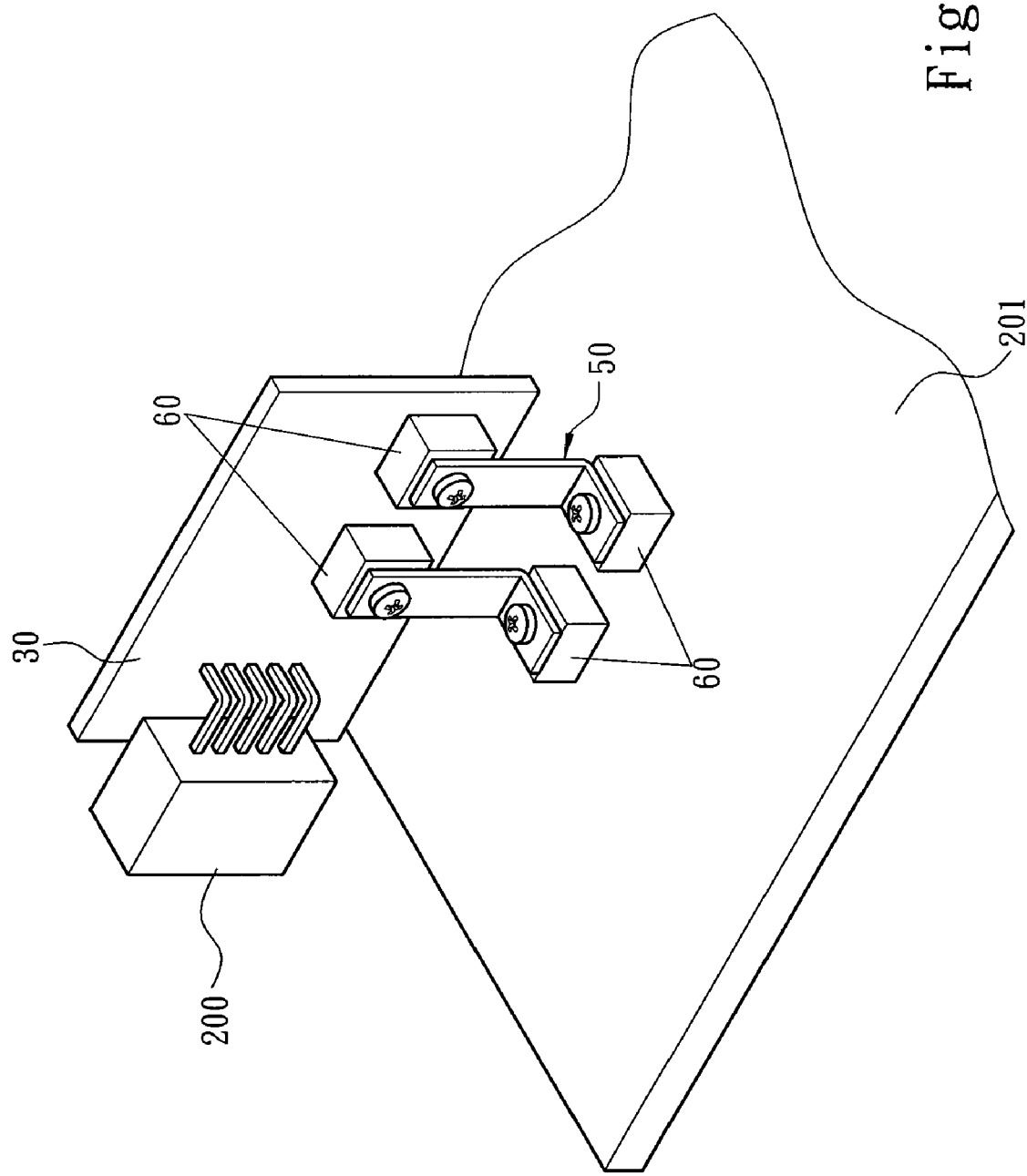
FIG. 3 is a schematic view showing the present invention in a first embodiment.

The present invention provides a structure for transmission in a power supply. Please refer to FIG. 3 which shows the present invention in a first embodiment. The power supply includes a power input port 200 for connecting to DC input power and a DC/DC conversion circuit for converting the DC input power into DC output power, wherein the DC/DC conversion circuit is mainly disposed on a power process board 201. Conventionally, the power input port 200 is connected to the power process board 201 by the large and bent multi-core or single-core wire. In the present invention, at least one power transmission board 30 is provided for disposing the power input port 200, and the power transmission board 30 is electrically connected to the power process board 201 with the DC/DC conversion circuit mounted thereon by at least one power conduction element 50. Here, the power conduction element 50 is used to replace the conventional bent multi-core or single-core wire. The power conduction element 50 can be made of rigid conductive material, such as copper or aluminum. Moreover, the power transmission board 30 and the power process board 201 both have electrical connection pins 60 corresponding to each other for mounting and positioning the power conduction elements 50 so as to achieve the electrical connection therebetween. Here, the connection between the power conduction elements 50 and the electrical connection pins 60 can be achieved by screw, terminal, solder and plug. The power transmission board 30 can be designed to be the EMI circuit board.

Figure 4:
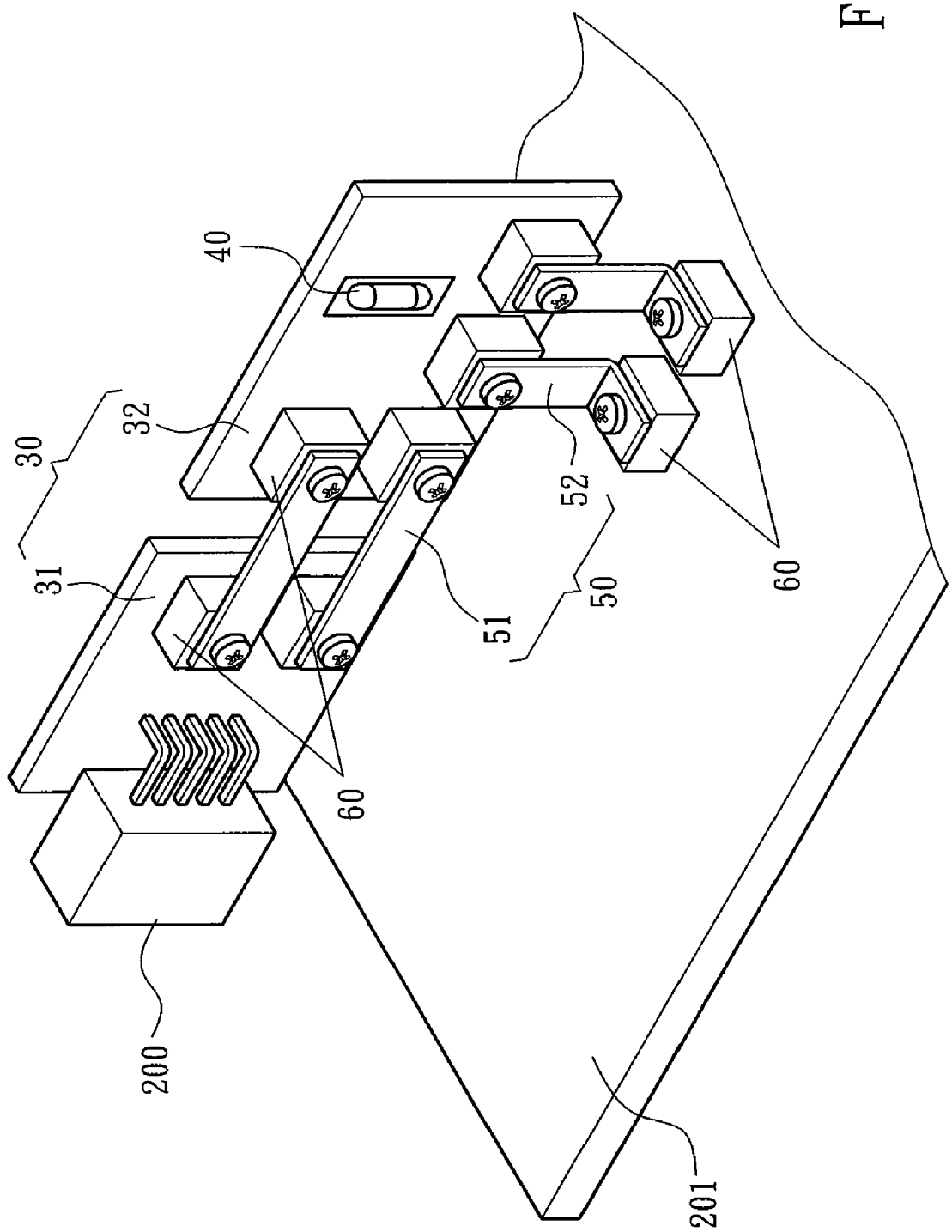
FIG. 4 is a schematic view showing the present invention in a second embodiment.

Furthermore, it also can be implemented to have plural power transmission boards 30 and plural power conduction elements 50, as shown in FIG. 4 which shows the present invention in a second embodiment. The plural power transmission boards 30 are respectively a first power transmission board 31 and a second power transmission board 32, and plural power conduction elements 50 are respectively a first power conduction element 51 and a second power conduction element 52, wherein the first and the second power conduction elements 51, 52 also can be made of rigid material, such as copper and aluminum. Here, the first power transmission board 31 and the second power transmission board 32 both have electrical connection pins 60 corresponding to each other for mounting and positioning the first power conduction element 51 so as to achieve the electrical connection therebetween, and the second power transmission board 32 and the power process board 201 both have electrical connection pins 60 corresponding to each other for mounting and positioning the second power conduction elements 52 so as to achieve the electrical connection therebetween. Here, the connection between the first and second power conduction elements 51, 52 and the electrical connection pins 60 can be achieved by screw, terminal, solder or plug, and the first power transmission board 31 can be designed to be the EMI circuit board and the second power transmission board 32 can be designed to have an overload protector 40 mounted thereon, wherein the overload protector 40 can be a fuse or a no-fuse switch.

Therefore, through the power conduction elements 50 cooperating with the power transmission board 30 to achieve the electrical connection between the power input port 200 and the power process board 201, the present invention can be easily applied to the system with large DC power to save more space than the conventional bent multi-core or single-core wire and still complying with the safety regulation. Besides, through the structure for transmission in the present invention, the occupied space can be precisely controlled to allow other components to have a close arrangement without collisions and damage caused therefrom as compared with the conventional multi-core or single-core wire which, owing to the bending behavior, can not precisely maintain a secure distance with other components and needs more reserved space for disposition. In addition, as employing plural power transmission boards 30, one thereof can be used to bear the overload protector 40 (as the second power transmission board 32 described above) for saving the space of the power process board 201 occupied by the conventional overload protector 40. Therefore, the present invention not only can save the occupied space by the connection wire, but also can increase the flexibility as designing the circuit.

Figure 5:
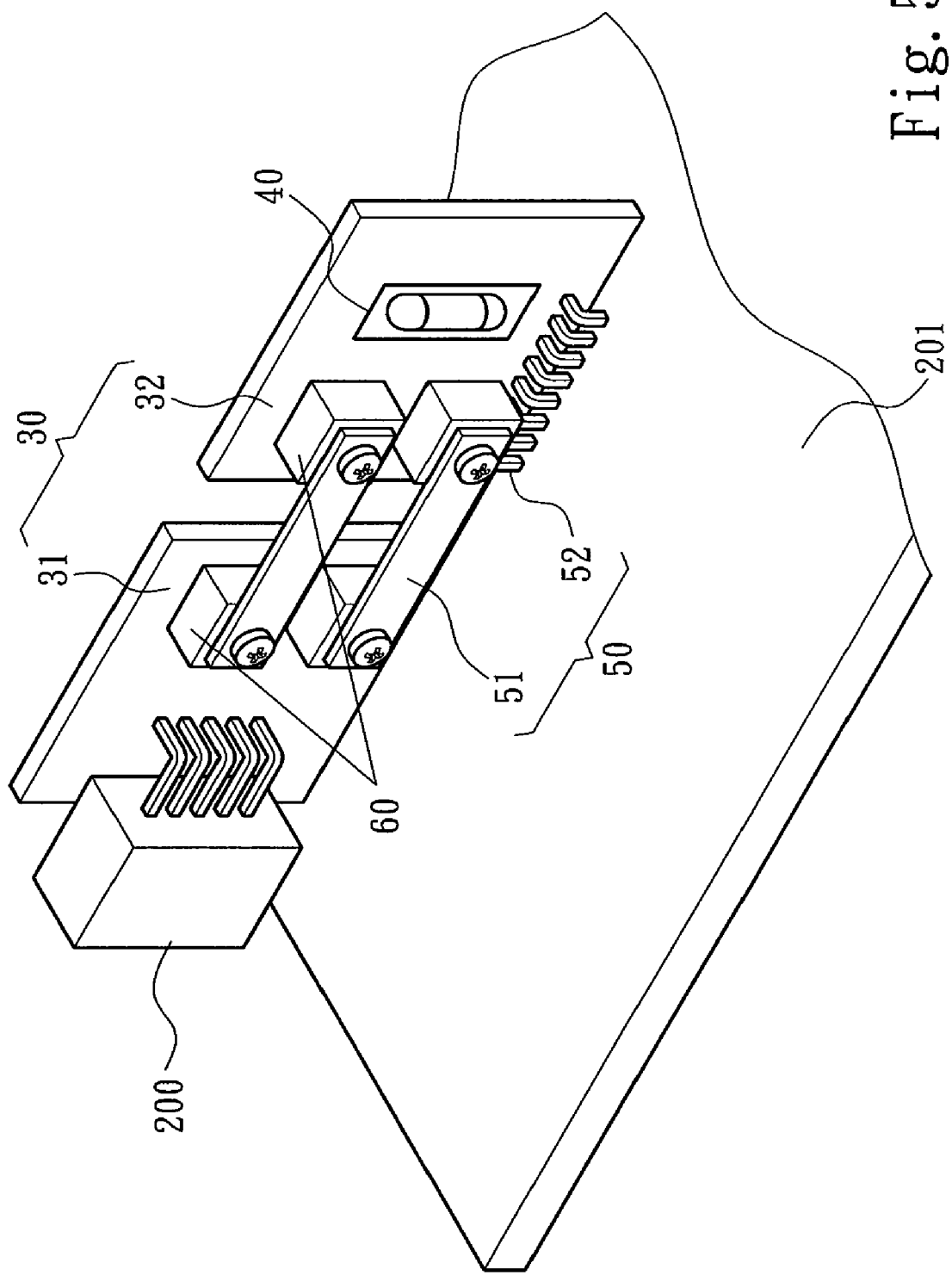
FIG. 5 is a schematic view showing the present invention in a third embodiment.

Although the present invention has described the above preferred embodiments, it is not limited. For example, the power conduction element 50 also can be implemented as shown in FIG. 5 and FIG. 6 which are respectively a schematic view and a vertical view of the present invention in a third embodiment, wherein the second power conduction elements 52 are implemented to be plural metal pins. Therefore, the present invention utilizes the rigid conductive material to replace the conventional multi-core or single-core wire with large diameter.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A structure for transmission in a power supply, which includes a power input port for connecting to DC input power and a DC/DC conversion circuit for converting the DC input power into DC output power, comprising:

at least one power transmission board for disposing the power input port, wherein the power transmission board is electrically connected to a power process board with the DC/DC conversion circuit substantially orthogonally mounted thereon by at least one power conduction element to provide a proper space to arrange an element of the power transmission board or a power processing board, where the at least one power conduction element is rigid and different to a connection wire;

wherein the at least one power transmission board receives the DC input power from the power input port, and transmits the DC input power to the DC/DC conversion circuit via the at least one power conduction element.

2. The structure for transmission as claimed in claim 1, wherein the power transmission board is an EMI circuit board.

3. The structure for transmission as claimed in claim 1, wherein the power transmission board is an EMI circuit board.

4. The structure for transmission as claimed in claim 1, wherein the power transmission board is made of copper or aluminum.

5. The structure for transmission as claimed in claim 4, wherein the power transmission board is an EMI circuit board.

6. The structure for transmission as claimed in claim 1, wherein the power transmission board and the power process board both have electrical connection pins corresponding to each other for mounting and positioning the power conduction elements so as to achieve the electrical connection therebetween.

7. The structure for transmission as claimed in claim 6, wherein the power transmission board is an EMI circuit board.

8. The structure for transmission as claimed in claim 6, wherein the connection between the power conduction elements and the electrical connection pins is achieved by screw, terminal, solder or plug.

9. The structure for transmission as claimed in claim 1, wherein the number of the power transmission board is implemented to be plural which are a first power transmission board and a second power transmission board, and the number of the power conduction element is implemented to be plural which are a first power conduction element and a second power conduction element.

10. The structure for transmission as claimed in claim 9, wherein the first power transmission board is an EMI circuit board.

11. The structure for transmission as claimed in claim 9, wherein the second power transmission board has an overload protector mounted thereon.

12. The structure for transmission as claimed in claim 9, wherein the first and the second power conduction elements are made of rigid conductive material.

13. The structure for transmission as claimed in claim 12, wherein the first power transmission board is an EMI circuit board.

14. The structure for transmission as claimed in claim 12, wherein the second power transmission board has an overload protector mounted thereon.

15. The structure for transmission as claimed in claim 12, wherein the first and the second power conduction elements are made of copper or aluminum.

16. The structure for transmission as claimed in claim 12, wherein the first power transmission board and the second power transmission board both have electrical connection pins corresponding to each other for mounting and positioning the first power conduction elements so as to achieve the electrical connection therebetween.

17. The structure for transmission as claimed in claim 16, wherein the connections between the first and second power conduction elements and the electrical connection pins are achieved by screw, terminal, solder or plug.

18. The structure for transmission as claimed in claim 12, wherein the second power transmission board and the power process board both have electrical connection pins corresponding to each other for mounting and positioning the second power conduction elements so as to achieve the electrical connection therebetween.

19. The structure for transmission as claimed in claim 18, wherein the connections between the second power conduction elements and the electrical connection pins are achieved by screw, terminal, solder or plug.

* * * * *